(12) United States Patent
Kim et al.

(10) Patent No.: US 8,634,269 B2
(45) Date of Patent: Jan. 21, 2014

(54) DATA OUTPUT CIRCUIT OF SEMICONDUCTOR MEMORY APPARATUS

(75) Inventors: Yong Mi Kim, Icheon-si (KR); Jeong Hun Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 12/983,185

(22) Filed: Dec. 31, 2010

(65) Prior Publication Data

US 2012/0044780 A1    Feb. 23, 2012

(30) Foreign Application Priority Data

Aug. 18, 2010   (KR) .................. 10-2010-0079933

(51) Int. Cl.
*G11C 8/16*     (2006.01)
(52) U.S. Cl.
USPC ............... 365/233.13; 365/189.15; 365/201; 365/233.1
(58) Field of Classification Search
USPC .... 365/189.011, 189.15 X, 201 X, 233.13 X, 365/233.13 O, 189.15, 201, 233.1, 233.13
See application file for complete search history.

(56) References Cited

U.S. PATENT DOCUMENTS

| | | | |
|---|---|---|---|
| 6,266,294 B1 | 7/2001 | Yada et al. | |
| 6,463,006 B2 * | 10/2002 | Nakano et al. | 365/233.12 |
| 6,707,758 B2 | 3/2004 | Kono | |
| 6,850,458 B2 | 2/2005 | Li | |
| 6,894,945 B2 * | 5/2005 | Sawada | 365/233.11 |
| 7,813,215 B2 | 10/2010 | Lee | |
| 7,818,526 B2 * | 10/2010 | Jang et al. | 711/167 |
| 2005/0094443 A1 | 5/2005 | Na | |
| 2005/0185484 A1 * | 8/2005 | Jang et al. | 365/201 |

FOREIGN PATENT DOCUMENTS

KR   10-2002-0048258 A    6/2002
KR   10-2010-0073620 A    7/2010

* cited by examiner

*Primary Examiner* — Vanthu Nguyen (74) *Attorney, Agent, or Firm* — William Park & Associates Patent Ltd.

(57) ABSTRACT

A data output circuit of a semiconductor memory apparatus includes: a data control driver configured to drive rising data and falling data to output control rising data and control falling data or drive level data to output the control rising data and the control falling data, in response to an output level test signal; a DLL clock control unit configured to drive a rising clock and a falling clock to output a control rising clock and a control falling clock in response to an enable signal and the output level test signal; and a clock synchronization unit configured to synchronize the control rising data and the control falling data with the control rising clock and the control falling clock to output serial rising data and serial falling data.

14 Claims, 6 Drawing Sheets

DATA OUTPUT CIRCUIT OF SEMICONDUCTOR MEMORY APPARATUS

CROSS-REFERENCES TO RELATED APPLICATION

The present application claims priority to Korean application number 10-2010-0079933, filed on Aug. 18, 2010, which is incorporated by reference in its entirety.

BACKGROUND OF THE INVENTION

1. Technical Field

Embodiments relate to a semiconductor integrated circuit, and more particularly, to a data output circuit of a semiconductor memory apparatus.

2. Related Art

In general, a semiconductor memory apparatus is configured to receive data from a pad (i.e., from the outside) and store the data therein, and configured to output the stored data to the pad (i.e., to the outside). Specifically, when the semiconductor memory apparatus receives data from the pad and stores the data therein, the semiconductor memory apparatus receives data in serial (hereinafter, referred to as 'serial data') and transforms the serial data to data in parallel (hereinafter, referred to as 'parallel data') to store the parallel data therein, and when the semiconductor memory apparatus outputs the stored data to the pad, the semiconductor memory apparatus transforms the stored parallel data to serial data to output the serial data to the pad.

Figure 1:
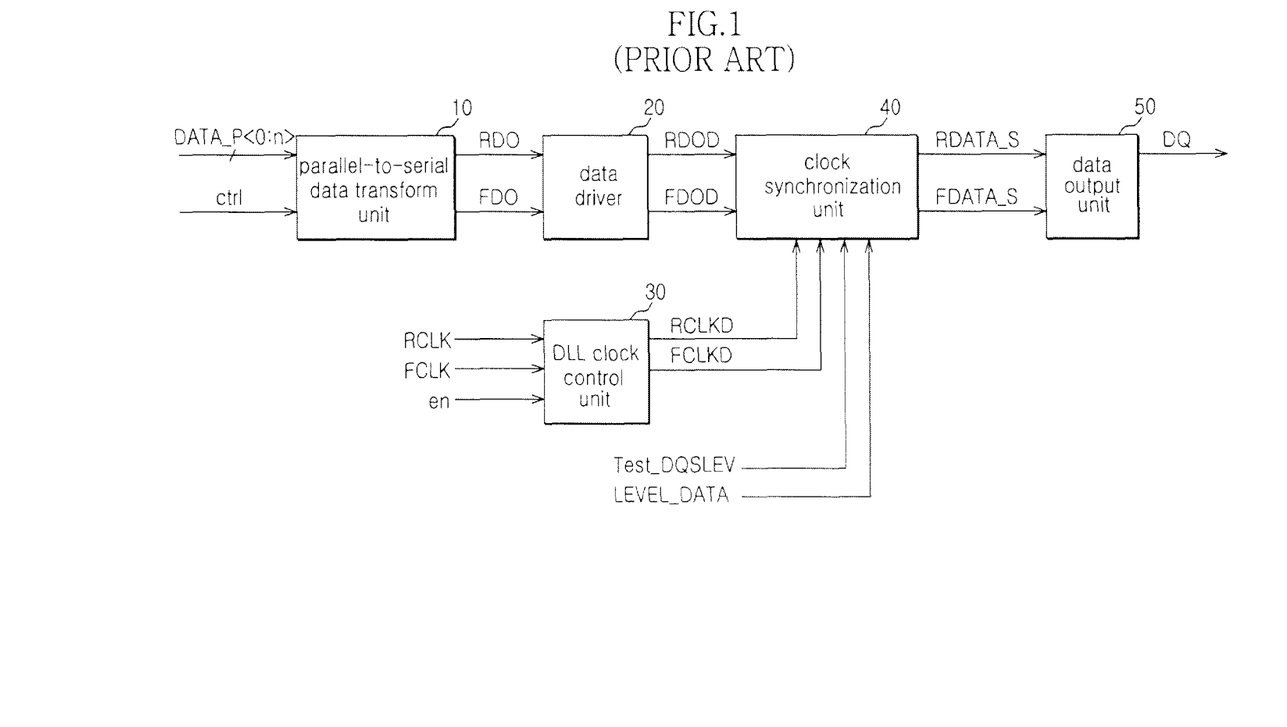
FIG. 1 is a block diagram showing a configuration of a data output circuit of a conventional semiconductor memory apparatus.

FIG. 1 is a block diagram showing a configuration of a data output circuit of a conventional semiconductor memory apparatus.

FIG. 1 shows a configuration that the conventional semiconductor memory apparatus transforms stored parallel data to serial data to output the serial data to the pad. As shown in FIG. 1, the conventional semiconductor memory apparatus includes a parallel-to-serial data transform unit 10, a data driver 20, a DLL clock control unit 30, a clock synchronization unit 40, and a data output unit 50.

The parallel-to-serial data transform unit 10 receives parallel data 'DATA_P<0:n>' outputted from a memory cell array (not shown) to generate rising data 'RDO' and falling data 'FDO' in serial, in response to a control signal 'ctrl'.

The data driver 20 drives the rising data 'RDO' and the falling data 'FDO' to output the driven data as driving rising data 'RDOD' and driving falling data 'FDOD', respectively.

The DLL clock control unit 30 drives a rising clock 'RCLK' and a falling clock 'FCLK', which are outputted from a DLL circuit (not shown), to output the driven clock as a driving rising clock 'RCLKD' and a driving falling clock 'FCLKD', respectively, based on an enable signal 'en'.

The clock synchronization unit 40 synchronizes the driving rising data 'RDOD' and the driving falling data 'FDOD' with the driving rising clock 'RCLKD' and the driving falling clock 'FCLKD', respectively, to output serial rising data 'RDATA_S' and serial falling data 'FDATA_S', in a normal operation (i.e., not in a test operation). In addition, the clock synchronization unit 40 generates the serial rising data 'RDATA_S' and the serial falling data 'FDATA_S' in response to level data signal 'LEVEL_DATA', in the test operation (i.e., in a case where an output level test signal 'Test_DQSLEV' is enabled).

The data output unit 50 generates output data 'DQ' in response to the serial rising data 'RDATA_S' and the serial falling data 'FDATA_S'. At this time, the output data 'DQ' are data which will be outputted to the outside of the semiconductor memory apparatus.

Figure 2:
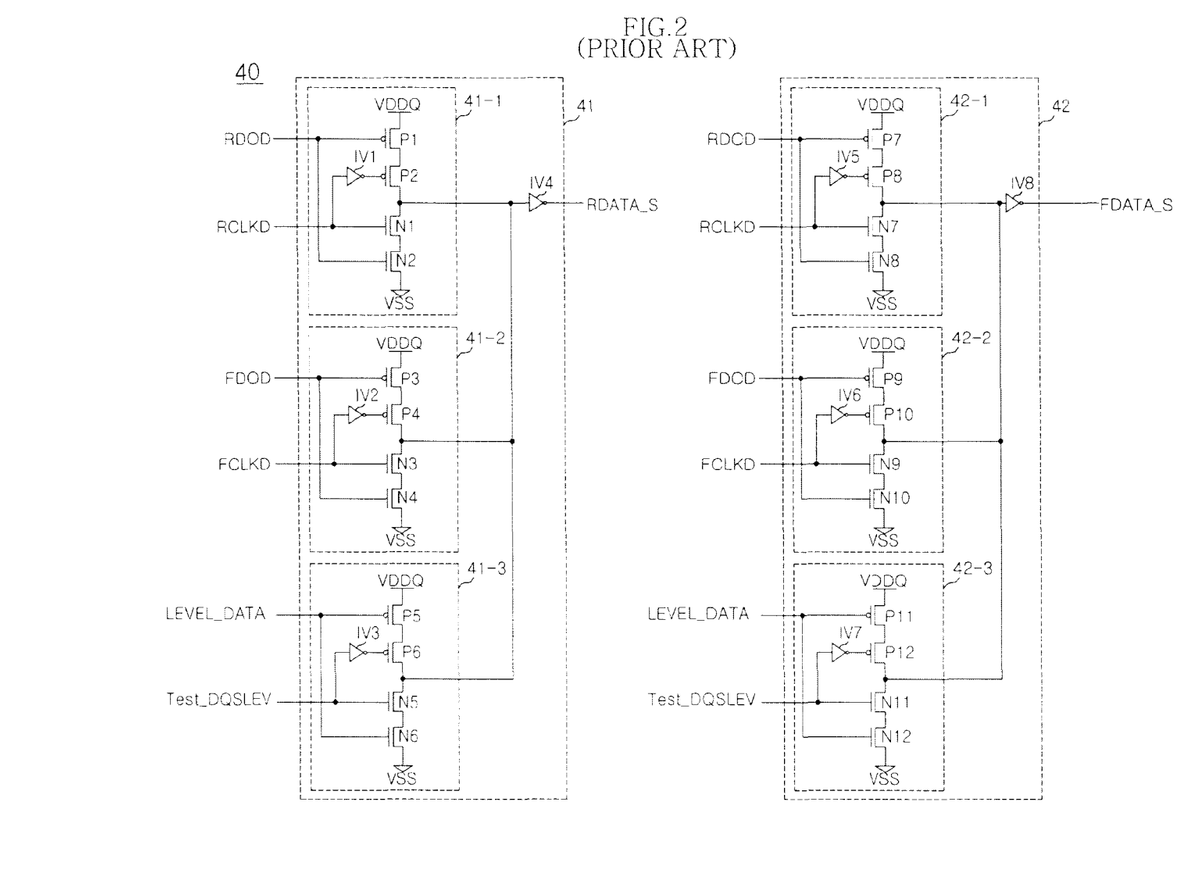
FIG. 2 is a diagram showing a configuration of a clock synchronization unit of FIG. 1.

FIG. 2 is a diagram showing a configuration of the clock synchronization unit 40 of FIG. 1.

As shown in FIG. 2, the clock synchronization unit 40 includes a serial rising data generating unit 41 and a serial falling data generating unit 42.

The serial rising data generating unit 41 includes first to third data synchronization units 41-1, 41-2, and 41-3.

The first data synchronization unit 41-1 includes first to fourth transistors P1, P2, N1, and N2, and a first inverter IV1.

The second data synchronization unit 41-2 includes fifth to eighth transistors P3, P4, N3, and N4, and a second inverter IV2.

The third data synchronization unit 41-3 includes ninth to twelfth transistors P5, P6, N5, and N6, and a third inverter IV3. Herein, the serial rising data 'RDATA_S' are outputted through a fourth inverter IV4 coupled to a node to which respective output terminals of the first to third data synchronization units 41-1, 41-2, and 41-3 are commonly coupled.

Like the serial rising data generating unit 41, the serial falling data generating unit 42 includes fourth to sixth data synchronization units 42-1, 42-2, and 42-3.

The fourth data synchronization unit 42-1 includes thirteenth to sixteenth transistors P7, P8, N7, and N8, and a fifth inverter IV5.

The fifth data synchronization unit 42-2 includes seventeenth to twentieth transistors P9, P10, N9, and N10, and a sixth inverter IV6.

The sixth data synchronization unit 42-3 includes twenty-first to twenty-fourth transistors P11, P12, N11, and N12, and a seventh inverter IV7. Herein, the serial falling data 'FDATA_S' are outputted through an eighth inverter IV8 coupled to a node to which respective output terminals of the fourth to sixth data synchronization units 42-1, 42-2, and 42-3 are commonly coupled.

In such a configuration, the clock synchronization unit 40 makes it difficult to realize a high-speed operation and a low power consumption of the semiconductor memory apparatus.

As shown in FIG. 2, the serial rising data generating unit 41 includes a node to which the respective output terminals of the first to third data synchronization units 41-1, 41-2, and 41-3 are commonly coupled. Therefore, in order to drive a node outputting the serial rising data 'RDATA_S', an amount of a current consumed in the respective data synchronization units 41-1, 41-2, and 41-3 should be increased. Otherwise, if the amount of the current consumed in the respective data synchronization units 41-1, 41-2, and 41-3 is not increased, a transition time of the serial rising data 'RDATA_S' which the serial rising data generating unit 41 outputs is increased, thereby it is difficult for the semiconductor memory apparatus to output the output data 'DQ' in a high speed.

Since the serial falling data generating unit 42 has substantially the same configuration as the serial rising data generating unit 41, an amount of a current consumed in the respective data synchronization units 42-1, 42-2, and 42-3 should be increased in order to drive a node to which the respective output terminals of the fourth to sixth data synchronization units 42-1, 42-2, and 42-3 are commonly coupled. Otherwise, if the amount of the current consumed in the respective data synchronization units 42-1, 42-2, and 42-3 is not increased, a transition time of the serial falling data 'FDATA_S' which the serial falling data generating unit 42 outputs is increased, thereby it is also difficult for the semiconductor memory apparatus to output the output data 'DQ' in a high speed.

SUMMARY OF THE INVENTION

The embodiments of the present invention include a data output circuit of a semiconductor memory apparatus which performs substantially the same operation as a conventional data output circuit and is suitable for realizing a high-speed operation and a low power consumption of the semiconductor memory apparatus.

In one embodiment of the present invention, a data output circuit of a semiconductor memory apparatus includes: a data control driver configured to drive rising data and falling data to output control rising data and control falling data or drive level data to output the control rising data and the control falling data, in response to an output level test signal; a DLL clock control unit configured to drive a rising clock and a falling clock to output a control rising clock and a control falling clock in response to an enable signal and the output level test signal; and a clock synchronization unit configured to synchronize the control rising data and the control falling data with the control rising clock and the control falling clock to output serial rising data and serial falling data.

In another embodiment of the present invention, a data output circuit of a semiconductor memory apparatus includes: a data control driver configured to drive rising data and falling data to output control rising data and control falling data if an output level test signal is enabled, and drive level data to output the control rising data and the control falling data if the output level test signal is disabled; a DLL clock control unit configured to receive a rising clock and a falling clock to output a control rising clock and a control falling clock, wherein the control rising clock and the control falling clock periodically transition or are fixed at a first predetermined level or are fixed at a second predetermined level in response to an enable signal and the output level test signal; and a clock synchronization unit configured to receive the control rising data and the control falling data to generate the serial rising data and the serial falling data in response to the control rising clock and the control falling clock.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a data output circuit of a semiconductor memory apparatus, according to the present invention, will be described below with reference to the accompanying drawings through preferred embodiments.

Figure 3:
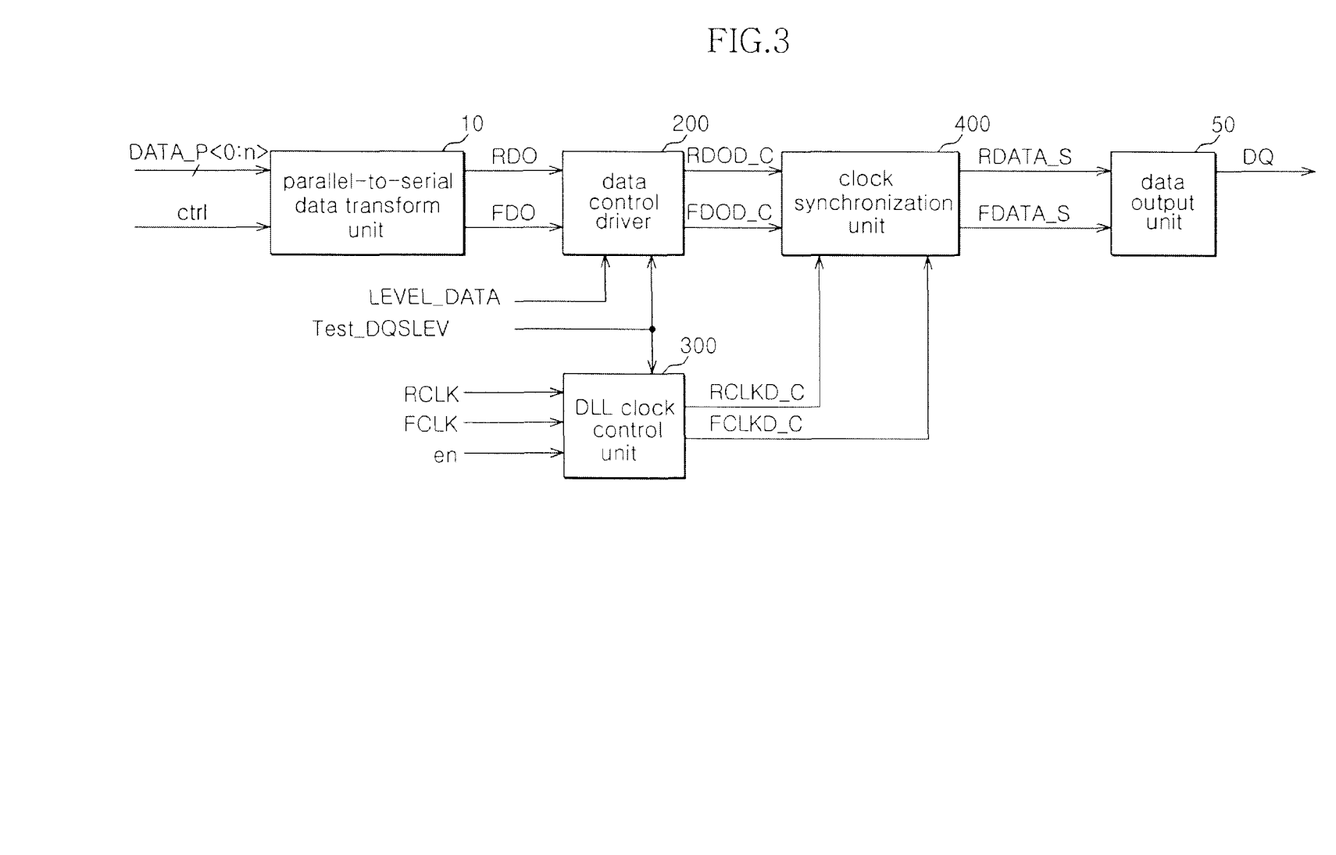
FIG. 3 is a block diagram showing a configuration of a data output circuit of a semiconductor memory apparatus according to an embodiment of the invention.

FIG. 3 is a block diagram showing a configuration of a data output circuit of a semiconductor memory apparatus according to an embodiment of the invention. As shown in FIG. 3, the data output circuit of the semiconductor memory apparatus includes a parallel-to-serial data transform unit 10, a data control driver 200, a DLL clock control unit 300, a clock synchronization unit 400, and a data output unit 50.

The parallel-to-serial data transform unit 10 receives parallel data 'DATA_P<0:n>', which are outputted from a memory cell array (not shown), to generate rising data 'RDO' and falling data 'FDO' in serial, in response to a control signal 'ctrl'.

The data control driver 200 drives the rising data 'RDO' and the falling data 'FDO' to output the driven data as control rising data 'RDOD_C' and control falling data 'FDOD_C', respectively, or drives level data signal 'LEVEL_DATA' to output the driven data as the control rising data 'RDOD_C' and the control falling data 'FDOD_C', in response to an output level test signal 'Test_DQSLEV'. The level data signal 'LEVEL_DATA' is a signal which the semiconductor memory apparatus provides to an external controller as a result of a write leveling operation before the semiconductor memory apparatus performs a normal operation. The external controller provides a clock, data, and a data strobe signal, all of which have substantially the same phase as each other, to the semiconductor memory apparatus.

Since the semiconductor memory apparatus is an apparatus configured to store data and output the stored data to a pad, the data and the data strobe signal which have substantially the same phase as each other should be inputted from the external controller to the semiconductor memory apparatus. However, due to a length of a line coupling the semiconductor memory apparatus to the external controller and the like, the data and the data strobe signal which have a different phase from each other can be inputted to the semiconductor memory apparatus.

Therefore, before the semiconductor memory apparatus performs the normal operation, the semiconductor memory apparatus detects phases of the clock and the data strobe signal to provide information on the phase difference between the clock and the data strobe signal to the external controller. The external controller varies the phase of the data strobe signal, so that the data and the data strobe signal having substantially the same phase as each other can be inputted to the semiconductor memory apparatus. The information on the phase difference between the clock and the data strobe signal is the level data signal 'LEVEL_DATA' mentioned above in the embodiment. However, the level data signal 'LEVEL_DATA' can be a signal which informs the external controller of information on the inside of the semiconductor memory apparatus as a result of a test and an operation which are performed inside the semiconductor memory apparatus.

The DLL clock control unit 300 drives a rising clock 'RCLK' and a falling clock 'FCLK', which are outputted from a DLL circuit (not shown), to output the driven clock as a control rising clock 'RCLKD_C' and a control falling clock 'FCLKD_C', respectively, in response to an enable signal 'en' and the output level test signal 'Test_DQSLEV'.

The clock synchronization unit 400 synchronizes the control rising data 'RDOD_C' and the control falling data 'FDOD_C' with the control rising clock 'RCLKD_C' and the control falling clock 'FCLKD_C', respectively, to output serial rising data 'RDATA_S' and serial falling data 'FDATA_S'.

The data output unit 50 generates output data 'DQ' in response to the serial rising data 'RDATA_S' and the serial falling data 'FDATA_S'. At this time, the output data 'DQ' are data which will be outputted to the outside of the semiconductor memory apparatus.

Figure 4:
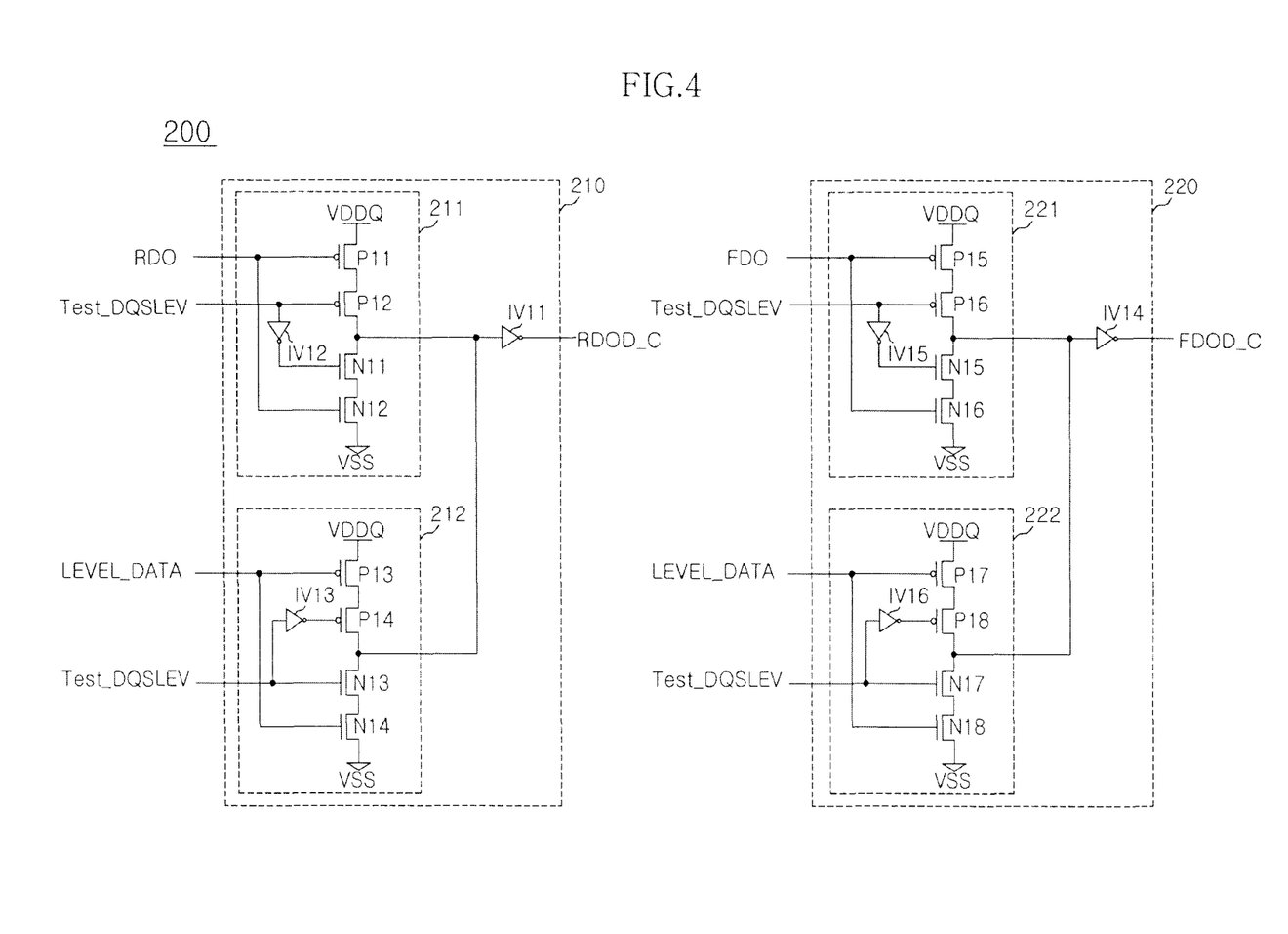
FIG. 4 is a diagram showing a configuration of a data control driver of FIG. 3.

FIG. 4 is a diagram showing a configuration of the data control driver 200 of FIG. 3. As shown in FIG. 4, the data control driver 200 includes a control rising data output unit 210 and a control falling data output unit 220.

The control rising data output unit 210 drives the rising data 'RDO' to output the driven data as the control rising data 'RDOD_C' or drives the level data signal 'LEVEL_DATA' to output the driven data as the control rising data 'RDOD_C', in response to the output level test signal 'Test_DQSLEV'.

The control rising data output unit 210 includes first and second drivers 211 and 212, and a first inverter IV11. Herein, the first inverter IV11 is coupled to a node to which output terminals of the first and second drivers 211 and 212 are commonly coupled.

The first driver 211 drives the rising data 'RDO' to output the driven data as the control rising data 'RDOD_C' if the output level test signal 'Test_DQSLEV' is disabled at a logic low level.

The first driver 211 includes first to fourth transistors P11, P12, N11, and N12, and a second inverter IV12. The first transistor P11 has a gate configured to receive the rising data 'RDO', and a source configured to receive an external voltage VDDQ. The second transistor P12 has a gate configured to receive the output level test signal 'Test_DQSLEV', and a source coupled to a drain of the first transistor P11. The second inverter IV12 receives the output level test signal 'Test_DQSLEV'. The third transistor N11 has a gate configured to receive an output signal of the second inverter IV12, and a drain coupled to a drain of the second transistor P12. The fourth transistor N12 has a gate configured to receive the rising data 'RDO', a drain coupled to a source of the third transistor N11, and a source coupled to a ground voltage VSS. Herein, an output terminal of the first driver 211 is a node to which the second and third transistors P12 and N11 are commonly coupled.

The second driver 212 drives the level data signal 'LEVEL_DATA' to output the driven data as the control rising data 'RDOD_C' if the output level test signal 'Test_DQSLEV' is enabled at a logic high level.

The second driver 212 includes fifth to eighth transistors P13, P14, N13, and N14, and a third inverter IV13. The fifth transistor P13 has a gate configured to receive the level data signal 'LEVEL_DATA', and a source configured to receive the external voltage VDDQ. The third inverter IV13 receives the output level test signal 'Test_DQSLEV'. The sixth transistor P14 has a gate configured to receive an output signal of the third inverter IV13, and a source coupled to a drain of the fifth transistor P13. The seventh transistor N13 has a gate configured to receive the output level test signal 'Test_DQSLEV', and a drain coupled to a drain of the sixth transistor P14. The eighth transistor N14 has a gate configured to receive the level data signal 'LEVEL_DATA', a drain coupled to a source of the seventh transistor N13, and a source coupled to the ground voltage VSS. Herein, an output terminal of the second driver 212 is a node to which the sixth and seventh transistors P14 and N13 are commonly coupled.

The control falling data output unit 220 drives the falling data 'FDO' to output the driven data as the control falling data 'FDOD_C' or drives the level data signal 'LEVEL_DATA' to output the driven data as the control falling data 'FDOD_C', in response to the output level test signal 'Test_DQSLEV'.

The control falling data output unit 220 includes third and fourth drivers 221 and 222, and a fourth inverter IV14. Herein, the fourth inverter IV14 is coupled to a node to which output terminals of the third and fourth drivers 221 and 222 are commonly coupled.

The third driver 221 drives the falling data 'FDO' to output the driven data as the control falling data 'FDOD_C' if the output level test signal 'Test_DQSLEV' is disabled at the logic low level.

The third driver 221 includes ninth to twelfth transistors P15, P16, N15, and N16, and a fifth inverter IV15. The ninth transistor P15 has a gate configured to receive the falling data 'FDO', and a source configured to receive the external voltage VDDQ. The tenth transistor P16 has a gate configured to receive the output level test signal 'Test_DQSLEV', and a source coupled to a drain of the ninth transistor P15. The fifth inverter IV15 receives the output level test signal 'Test_DQSLEV'. The eleventh transistor N15 has a gate configured to receive an output signal of the fifth inverter IV15, and a drain coupled to a drain of the tenth transistor P16. The twelfth transistor N16 has a gate configured to receive the falling data 'FDO', a drain coupled to a source of the eleventh transistor N15, and a source coupled to the ground voltage VSS. Herein, an output terminal of the third driver 221 is a node to which the tenth and eleventh transistors P16 and N15 are commonly coupled.

The fourth driver 222 drives the level data signal 'LEVEL_DATA' to output the driven data as the control falling data 'FDOD_C' if the output level test signal 'Test_DQSLEV' is enabled at the logic high level.

The fourth driver 222 includes thirteenth to sixteenth transistors P17, P18, N17, and N18, and a sixth inverter IV16. The thirteenth transistor P17 has a gate configured to receive the level data signal 'LEVEL_DATA', and a source configured to receive the external voltage VDDQ. The sixth inverter IV16 receives the output level test signal 'Test_DQSLEV'. The fourteenth transistor P18 has a gate configured to receive an output signal of the sixth inverter IV16, and a source coupled to a drain of the thirteenth transistor P17. The fifteenth transistor N17 has a gate configured to receive the output level test signal 'Test_DQSLEV', and a drain coupled to a drain of the fourteenth transistor P18. The sixteenth transistor N18 has a gate configured to receive the level data signal 'LEVEL_DATA', a drain coupled to a source of the fifteenth transistor N17, and a source coupled to the ground voltage VSS. Herein, an output terminal of the fourth driver 222 is a node to which the fourteenth and fifteenth transistors P18 and N17 are commonly coupled.

Figure 5:
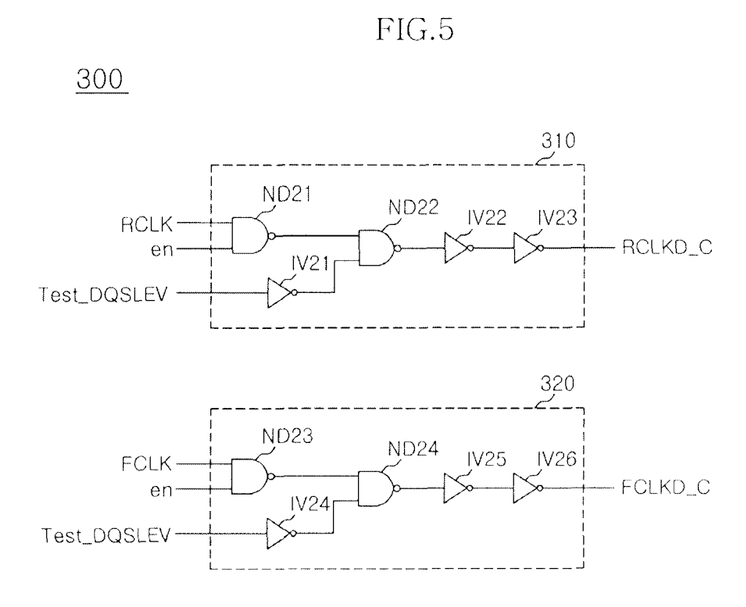
FIG. 5 is a diagram showing a configuration of a DLL clock control unit of FIG. 3.

FIG. 5 is a diagram showing a configuration of the DLL clock control unit 300 of FIG. 3. As shown in FIG. 5, the DLL clock control unit 300 includes a control rising clock output unit 310 and a control falling clock output unit 320.

The control rising clock output unit 310 drives the rising clock 'RCLK' to output the driven clock as the control rising clock 'RCLKD_C' if the enable signal 'en' is enabled and the output level test signal 'Test_DQSLEV' is disabled. In addition, the control rising clock output unit 310 fixes the control rising clock 'RCLKD_C' at a first predetermined level (i.e., a logic low level) if the enable signal 'en' is disabled and the output level test signal 'Test_DQSLEV' is disabled, and fixes the control rising clock 'RCLKD_C' at a second predetermined level (i.e., a logic high level) if the output level test signal 'Test_DQSLEV' is enabled.

The control rising clock output unit 310 includes first and second NAND gates ND21 and ND22, and seventh to ninth inverters IV21, IV22, and IV23. The first NAND gate ND21 receives the rising clock 'RCLK' and the enable signal 'en'.

The seventh inverter IV21 receives the output level test signal 'Test_DQSLEV'. The second NAND gate ND22 receives an output signal of the first NAND gate ND21 and an output signal of the seventh inverter IV21. The eighth inverter IV22 receives an output signal of the second NAND gate ND22. The ninth inverter IV23 receives an output signal of the eighth inverter IV22 to output the control rising clock 'RCLKD_C'.

The control falling clock output unit 320 drives the falling clock 'FCLK' to output the driven clock as the control falling clock 'FCLKD_C' if the enable signal 'en' is enabled and the output level test signal 'Test_DQSLEV' is disabled. In addition, the control falling clock output unit 320 fixes the control falling clock 'FCLKD_C' at the first predetermined level (i.e., the logic low level) if the enable signal 'en' is disabled and the output level test signal 'Test_DQSLEV' is disabled, and fixes the control falling clock 'FCLKD_C' at the second predetermined level (i.e., the logic high level) if the output level test signal 'Test_DQSLEV' is enabled.

The control falling clock output unit 320 includes third and fourth NAND gates ND23 and ND24, and tenth to twelfth inverters IV24, IV25, and IV26. The third NAND gate ND23 receives the falling clock 'FCLK' and the enable signal 'en'. The tenth inverter IV24 receives the output level test signal 'Test_DQSLEV'. The fourth NAND gate ND24 receives an output signal of the third NAND gate ND23 and an output signal of the tenth inverter IV24. The eleventh inverter IV25 receives an output signal of the fourth NAND gate ND24. The twelfth inverter IV26 receives an output signal of the eleventh inverter IV25 to output the control falling clock 'FCLKD_C'.

Figure 6:
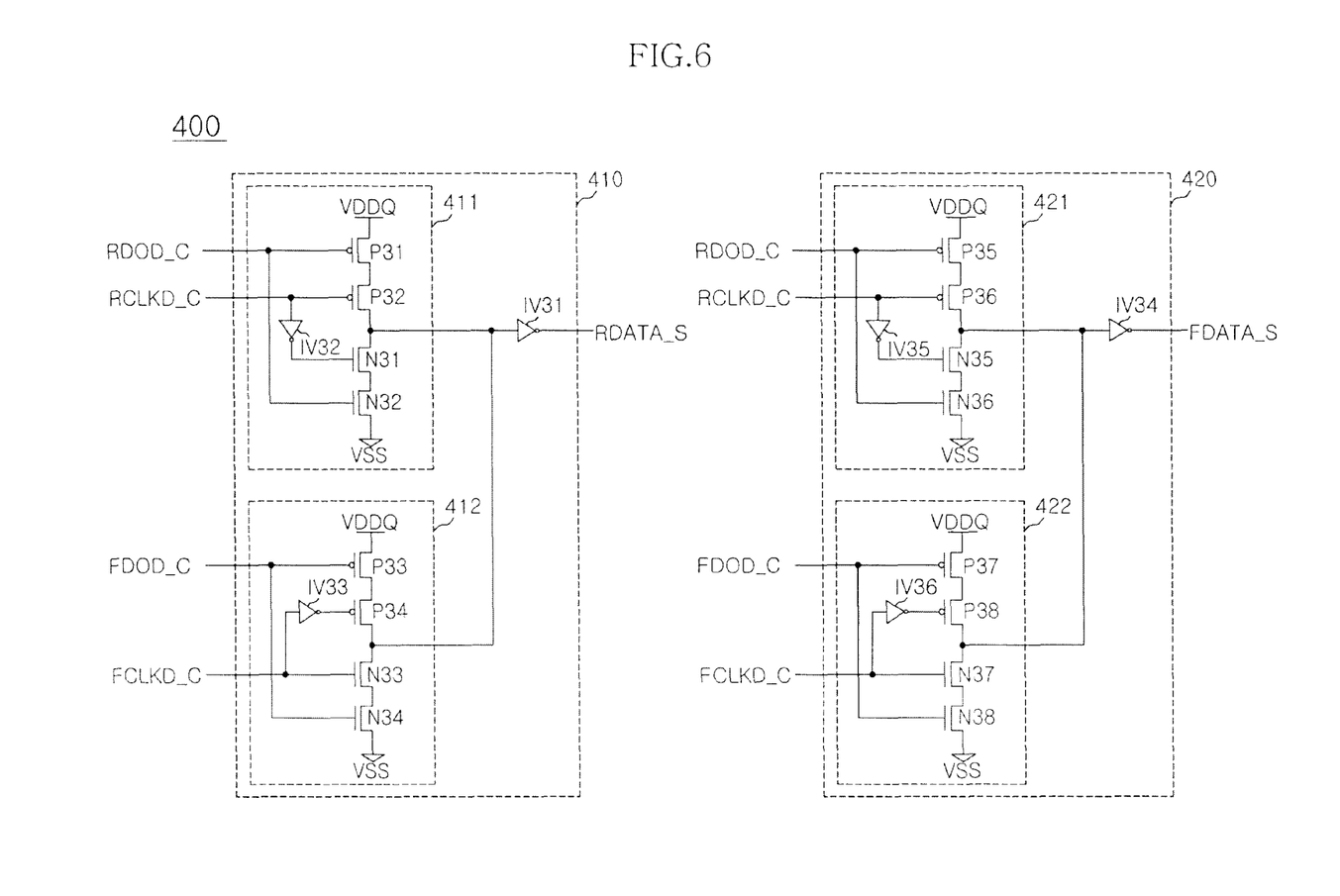
FIG. 6 is a diagram showing a configuration of a clock synchronization unit of FIG. 3.

FIG. 6 is a diagram showing a configuration of the clock synchronization unit 400 of FIG. 3. As shown in FIG. 6, the clock synchronization unit 400 includes a first data synchronization unit 410 and a second data synchronization unit 420.

The first data synchronization unit 410 synchronizes the control rising data 'RDOD_C' and the control falling data 'FDOD_C' with the control rising clock 'RCLKD_C' and the control falling clock 'FCLKD_C', respectively, to output the synchronized data as the serial rising data 'RDATA_S'.

The first data synchronization unit 410 includes fifth and sixth drivers 411 and 412, and a thirteenth inverter IV31. Herein, the thirteenth inverter IV31 is coupled to a node to which output terminals of the fifth and sixth drivers 411 and 412 are commonly coupled.

The fifth driver 411 outputs the control rising data 'RDOD_C' as the serial rising data 'RDATA_S' at a timing point when the control rising clock 'RCLKD_C' transitions to the logic high level. In addition, the fifth driver 411 drives the control rising data 'RDOD_C' to output the driven data as the serial rising data 'RDATA_S' if the control rising clock 'RCLKD_C' is fixed at the logic high level, and makes its output terminal floating regardless of the control rising data 'RDOD_C' if the control rising clock 'RCLKD_C' is fixed at the logic low level.

The fifth driver 411 includes seventeenth to twentieth transistors P31, P32, N31, and N32, and a fourteenth inverter IV32. The seventeenth transistor P31 has a gate configured to receive the control rising data 'RDOD_C', and a source configured to receive the external voltage VDDQ. The fourteenth inverter IV32 receives the control rising clock 'RCLKD_C'. The eighteenth transistor P32 has a gate configured to receive an output signal of the fourteenth inverter IV32, and a source coupled to a drain of the seventeenth transistor P31. The nineteenth transistor N31 has a gate configured to receive the control rising clock 'RCLKD_C', and a drain coupled to a drain of the eighteenth transistor P32. The twentieth transistor N32 has a gate configured to receive the control rising data 'RDOD_C', a drain coupled to a source of the nineteenth transistor N31, and a source coupled to the ground voltage VSS. Herein, an output terminal of the fifth driver 411 is a node to which the eighteenth and nineteenth transistors P32 and N31 are commonly coupled.

The sixth driver 412 outputs the control falling data 'FDOD_C' as the serial falling data 'FDATA_S' at a timing point when the control falling clock 'FCLKD_C' transitions to the logic high level. In addition, the sixth driver 412 drives the control falling data 'FDOD_C' to output the driven data as the serial rising data 'RDATA_S' if the control falling clock 'FCLKD_C' is fixed at the logic high level, and makes its output terminal floating regardless of the control falling data 'FDOD_C' if the control falling clock 'FCLKD_C' is fixed at the logic low level.

The sixth driver 412 includes twenty-first to twenty-fourth transistors P33, P34, N33, and N34, and a fifteenth inverter IV33. The twenty-first transistor P33 has a gate configured to receive the control falling data 'FDOD_C', and a source configured to receive the external voltage VDDQ. The fifteenth inverter IV33 receives the control falling clock 'FCLKD_C'. The twenty-second transistor P34 has a gate configured to receive an output signal of the fifteenth inverter IV33, and a source coupled to a drain of the twenty-first transistor P33. The twenty-third transistor N33 has a gate configured to receive the control falling clock 'FCLKD_C', and a drain coupled to a drain of the twenty-second transistor P34. The twenty-fourth transistor N34 has a gate configured to receive the control falling data 'FDOD_C', a drain coupled to a source of the twenty-third transistor N33, and a source coupled to the ground voltage VSS. Herein, an output terminal of the sixth driver 412 is a node to which the twenty-second and twenty-third transistors P34 and N33 are commonly coupled.

The second data synchronization unit 420 synchronizes the control rising data 'RDOD_C' and the control falling data 'FDOD_C' with the control rising clock 'RCLKD_C' and the control falling clock 'FCLKD_C', respectively, to output the synchronized data as the serial falling data 'FDATA_S'.

The second data synchronization unit 420 includes seventh and eighth drivers 421 and 422, and a sixteenth inverter IV34. Herein, the sixteenth inverter IV34 is coupled to a node to which output terminals of the seventh and eighth drivers 421 and 422 are commonly coupled.

The seventh driver 421 outputs the control rising data 'RDOD_C' as the serial falling data 'FDATA_S' at a timing point when the control rising clock 'RCLKD_C' transitions to the logic high level. In addition, the seventh driver 421 drives the control rising data 'RDOD_C' to output the driven data as the serial falling data 'FDATA_S' if the control rising clock 'RCLKD_C' is fixed at the logic high level, and makes its output terminal floating regardless of the control rising data 'RDOD_C' if the control rising clock 'RCLKD_C' is fixed at the logic low level.

The seventh driver 421 includes twenty-fifth to twenty-eighth transistors P35, P36, N35, and N36, and a seventeenth inverter IV35. The twenty-fifth transistor P35 has a gate configured to receive the control rising data 'RDOD_C', and a source configured to receive the external voltage VDDQ. The seventeenth inverter IV35 receives the control rising clock 'RCLKD_C'. The twenty-sixth transistor P36 has a gate configured to receive an output signal of the seventeenth inverter IV35, and a source coupled to a drain of the twenty-fifth transistor P35. The twenty-seventh transistor N35 has a gate configured to receive the control rising clock 'RCLKD_C', and a drain coupled to a drain of the twenty-sixth transistor P36. The twenty-eighth transistor N36 has a gate configured to receive the control rising data 'RDOD_C', a drain coupled to a source of the twenty-seventh transistor N35, and a source coupled to the ground voltage VSS. Herein, an output terminal of the seventh driver 421 is a node to which the twenty-sixth and twenty-seventh transistors P36 and N35 are commonly coupled.

The eighth driver 422 outputs the control falling data 'FDOD_C' as the serial falling data 'FDATA_S' at a timing point when the control falling clock 'FCLKD_C' transitions to the logic high level. In addition, the eighth driver 422 drives the control falling data 'FDOD_C' to output the driven data as the serial falling data 'FDATA_S' if the control falling clock 'FCLKD_C' is fixed at the logic high level, and makes its output terminal floating regardless of the control falling data 'FDOD_C' if the control falling clock 'FCLKD_C' is fixed at the logic low level.

The eighth driver 422 includes twenty-ninth to thirty-second transistors P37, P38, N37, and N38, and an eighteenth inverter IV36. The twenty-ninth transistor P37 has a gate configured to receive the control falling data 'FDOD_C', and a source configured to receive the external voltage VDDQ. The eighteenth inverter IV36 receives the control falling clock 'FCLKD_C'. The thirtieth transistor P38 has a gate configured to receive an output signal of the eighteenth inverter IV36, and a source coupled to a drain of the twenty-ninth transistor P37. The thirty-first transistor N37 has a gate configured to receive the control falling clock 'FCLKD_C', and a drain coupled to a drain of the thirtieth transistor P38. The thirty-second transistor N38 has a gate configured to receive the control falling data 'FDOD_C', a drain coupled to a source of the thirty-first transistor N37, and a source coupled to the ground voltage VSS. Herein, an output terminal of the eighth driver 422 is a node to which the thirtieth and thirty-first transistors P38 and N37 are commonly coupled.

In such a configuration, the data output circuit of the semiconductor memory apparatus according to the embodiment operates as follows.

The parallel-to-serial data transform unit 10 receives parallel data 'DATA_P<0:n>', which are outputted from the memory cell array (not shown), to generate rising data 'RDO' and falling data 'FDO' in serial, in response to the control signal 'ctrl'.

The data control driver 200 drives the rising data 'RDO' and the falling data 'FDO' to output the driven data as the control rising data 'RDOD_C' and the control falling data 'FDOD_C', respectively, or drives the level data signal 'LEVEL_DATA' to output the driven data as the control rising data 'RDOD_C' and the control falling data 'FDOD_C', in response to the output level test signal 'Test_DQSLEV'. For example, if the output level test signal 'Test_DQSLEV' is disabled, the data control driver 200 drives the rising data 'RDO' and the falling data 'FDO' to output the driven data as the control rising data 'RDOD_C' and the control falling data 'FDOD_C', respectively, and if the output level test signal 'Test_DQSLEV' is enabled, the data control driver 200 drives the level data signal 'LEVEL_DATA' to output the driven data as the control rising data 'RDOD_C' and the control falling data 'FDOD_C'.

The DLL clock control unit 300 drives the rising clock 'RCLK' and the falling clock 'FCLK', which are outputted from the DLL circuit (not shown), to output the driven clock as the control rising clock 'RCLKD_C' and the control falling clock 'FCLKD_C', respectively, in response to the enable signal 'en' and the output level test signal 'Test_DQSLEV'. For example, the DLL clock control unit 300 drives the rising clock 'RCLK' and the falling clock 'FCLK' to output the control rising clock 'RCLKD_C' and the control falling clock 'FCLKD_C' which periodically transition between the first predetermined level (i.e., the logic low level) and the second predetermined level (i.e., the logic high level), respectively, if the output level test signal 'Test_DQSLEV' is disabled and the enable signal 'en' is enabled. In addition, the DLL clock control unit 300 fixes the control rising clock 'RCLKD_C' and the control falling clock 'FCLKD_C' at the first predetermined level (i.e., the logic low level) if the output level test signal 'Test_DQSLEV' is disabled and the enable signal 'en' is disabled, and fixes the control rising clock 'RCLKD_C' and the control falling clock 'FCLKD_C' at the second predetermined level (i.e., the logic high level) if the output level test signal 'Test_DQSLEV' is enabled.

The clock synchronization unit 400 synchronizes the control rising data 'RDOD_C' and the control falling data 'FDOD_C' with the control rising clock 'RCLKD_C' and the control falling clock 'FCLKD_C', respectively, to output the serial rising data 'RDATA_S' and the serial falling data 'FDATA_S' if the control rising clock 'RCLKD_C' and the control falling clock 'FCLKD_C' transition between the first predetermined level (i.e., the logic low level) and the second predetermined level (i.e., the logic high level). In other words, if the control rising clock 'RCLKD_C' and the control falling clock 'FCLKD_C' periodically transition between the first predetermined level (i.e., the logic low level) and the second predetermined level (i.e., the logic high level), the clock synchronization unit 400 drives the control rising data 'RDOD_C' and the control falling data 'FDOD_C' at a timing point when the control rising clock 'RCLKD_C' and the control falling clock 'FCLKD_C' transition to the second predetermined level (i.e., the logic high level) and outputs the driven data as the serial rising data 'RDATA_S' and the serial falling data 'FDATA_S'. Meanwhile, the clock synchronization unit 400 makes output terminals of the clock synchronization unit 400 (i.e., the respective output terminals of the first and second data synchronization units 410 and 420 in FIG. 6) floating regardless of the control rising data 'RDOD_C' and the control falling data 'FDOD_C' if the control rising clock 'RCLKD_C' and the control falling clock 'FCLKD_C' are fixed at the first predetermined level (i.e., the logic low level). In addition, the clock synchronization unit 400 generates the serial rising data 'RDATA_S' and the serial falling data 'FDATA_S' in response to levels of the control rising data 'RDOD_C' and the control falling data 'FDOD_C' if the control rising clock 'RCLKD_C' and the control falling clock 'FCLKD_C' are fixed at the second predetermined level (i.e., the logic high level).

The data output unit 50 generates the output data 'DQ' in response to the serial rising data 'RDATA_S' and the serial falling data 'FDATA_S'. At this time, the output data 'DQ' are data which will be outputted to the outside of the semiconductor memory apparatus.

The data output circuit of the semiconductor memory apparatus according to the embodiment synchronizes the control rising data 'RDOD_C' and the control falling data 'FDOD_C' with the control rising clock 'RCLKD_C' and the control falling clock 'FCLKD_C', respectively, to output the serial rising data 'RDATA_S' and the serial falling data 'FDATA_S' or makes the output terminals of the clock synchronization unit 400 floating based on the enable signal 'en' if the output level test signal 'Test_DQSLEV' is disabled, and generates the control rising data 'RDOD_C' and the control falling data 'FDOD_C' based on a voltage level of the signal 'LEVEL_DATA' and generates the serial rising data 'RDATA_S' and the serial falling data 'FDATA_S' based on the generated control rising data 'RDOD_C' and the generated control falling data 'FDOD_C' if the output level test signal 'Test_DQSLEV' is enabled. The serial rising data 'RDA- TA_S' and the serial falling data 'FDATA_S' generated in this way are outputted to the outside of the semiconductor memory apparatus through the data output unit 50.

In this way, the data output circuit of the semiconductor memory apparatus according to the embodiment can perform substantially the same operation as the conventional data output circuit in the prior art.

To compare the clock synchronization unit 40 of the prior art of FIG. 2 with the clock synchronization unit 400 of the embodiment of FIG. 6, the number of output nodes of the clock synchronization unit 400 of the embodiment is less than the number of output nodes of the clock synchronization unit 40 of the prior art by as much as circuits 41-3 and 42-3, thereby the output nodes of the clock synchronization unit 400 can be driven with less driving capability. Therefore, a data process loading speed of the clock synchronization unit 400 of the embodiment can be greater than that of the clock synchronization unit 40 of the prior art, and thus the clock synchronization unit 400 of the embodiment is suitable for realizing a high-speed operation and a low power consumption of the semiconductor memory apparatus.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A data output circuit of a semiconductor memory apparatus comprising:
   a data control driver configured to drive rising data and falling data which are outputted from a memory cell array to output control rising data and control falling data when an output level test signal is enabled, and drive level data which is outputted from an external controller to output the control rising data and the control falling data when the output level test signal is disabled;
   a DLL clock control unit configured to drive a rising clock and a falling clock to output a control rising clock and a control falling clock in response to an enable signal and the output level test signal; and
   a clock synchronization unit configured to synchronize the control rising data and the control falling data with the control rising clock and the control falling clock, respectively, to output serial rising data and serial falling data.

2. The data output circuit of claim 1, wherein the data control driver includes:
   a control rising data output unit configured to drive the rising data to output the driven data as the control rising data or to drive the level data to output the driven data as the control rising data, in response to the output level test signal; and
   a control falling data output unit configured to drive the falling data to output the driven data as the control falling data or to drive the level data to output the driven data as the control falling data, in response to the output level test signal.

3. The data output circuit of claim 2, wherein the control rising data output unit includes:
   a first driver configured to drive the rising data to output the driven data as the control rising data if the output level test signal is disabled; and
   a second driver configured to drive the level data to output the driven data as the control rising data if the output level test signal is enabled,
   wherein an output terminal of the first driver and an output terminal of the second driver are coupled to each other.

4. The data output circuit of claim 2, wherein the control falling data output unit includes:
   a first driver configured to drive the falling data as the control falling data if the output level test signal is disabled; and
   a second driver configured to drive the level data to output the driven data as the control falling data if the output level test signal is enabled,
   wherein an output terminal of the first driver and an output terminal of the second driver are coupled to each other.

5. The data output circuit of claim 1, wherein the DLL clock control unit includes:
   a control rising clock output unit configured to drive the rising clock to output the driven clock as the control rising clock if the enable signal is enabled and the output level test signal is disabled; and
   a control falling clock output unit configured to drive the falling clock to output the driven clock as the control falling clock if the enable signal is enabled and the output level test signal is disabled.

6. The data output circuit of claim 5, wherein the control rising clock output unit is configured to fix the control rising clock at a first predetermined level if the enable signal is disabled and the output level test signal is disabled, and fix the control rising clock at a second predetermined level if the output level test signal is enabled.

7. The data output circuit of claim 5, wherein the control falling clock output unit is configured to fix the control falling clock at a first predetermined level if the enable signal is disabled and the output level test signal is disabled, and fix the control falling clock at a second predetermined level if the output level test signal is enabled.

8. The data output circuit of claim 1, wherein the clock synchronization unit includes:
   a first data synchronization unit configured to synchronize the control rising data with the control rising clock to output the synchronized data as the serial rising data; and
   a second data synchronization unit configured to synchronize the control falling data with the control falling clock to output the synchronized data as the serial falling data.

9. The data output circuit of claim 8, wherein the first data synchronization unit is configured to output the control rising data as the serial rising data when the control rising clock transitions to a predetermined level.

10. The data output circuit of claim 8, wherein the second data synchronization unit is configured to output the control falling data as the serial falling data when the control falling clock transitions to a predetermined level.

11. A data output circuit of a semiconductor memory apparatus comprising:
    a data control driver configured to drive rising data and falling data which are outputted from a memory cell array to output control rising data and control falling data when an output level test signal is enabled, and drive level data which is outputted from an external controller to output the control rising data and the control falling data when the output level test signal is disabled;
    a DLL clock control unit configured to receive a rising clock and a falling clock to output a control rising clock and a control falling clock, wherein the control rising clock and the control falling clock periodically transition or are fixed at a first predetermined level or are fixed at a second predetermined level in response to an enable signal and the output level test signal; and a clock synchronization unit configured to receive the control rising data and the control falling data to generate a serial rising data and a serial falling data in response to the control rising clock and the control falling clock.

12. The data output circuit of claim 11, wherein the data control driver includes:

a control rising data output unit configured to drive the rising data to output the driven data as the control rising data if the output level test signal is disabled, and drive the level data to output the driven data as the control rising data if the output level test signal is enabled; and a control falling data output unit configured to drive the falling data to output the driven data as the control falling data if the output level test signal is disabled, and drive the level data to output the driven data as the control falling data if the output level test signal is enabled.

13. The data output circuit of claim 11, wherein DLL clock control unit is configured to drive the rising clock and the falling clock to output the control rising clock and the control falling clock, respectively, if the output level test signal is disabled and the enable signal is enabled, wherein the control rising clock and the control falling clock transition between the first predetermined level and the second predetermined level, and configured to fix the control rising clock and the control falling clock at the first predetermined level if the output level test signal is disabled and the enable signal is disabled, and configured to fix the control rising clock and the control falling clock at the second predetermined level if the output level test signal is enabled.

14. The data output circuit of claim 13, wherein the clock synchronization unit is configured to make an output terminal of the clock synchronization unit float regardless of the control rising data and the control falling data if the control rising clock and the control falling clock are fixed at the first predetermined level, and configured to generate the serial rising data and the serial falling data in response to the control rising data and the control falling data if the control rising clock and the control falling clock are fixed at the second predetermined level, and configured to drive the control rising data and the control falling data to output the serial rising data and the serial falling data at a timing point when the control rising clock and the control falling clock transition to the second predetermined level if the control rising clock and the control falling clock are outputted by driving the rising clock and the falling clock and periodically transition.

* * * * *